United States Patent
Wei

(10) Patent No.: US 8,300,402 B2
(45) Date of Patent: Oct. 30, 2012

(54) SERVER SYSTEM WITH HEAT DISSIPATION DEVICE

(75) Inventor: Chao-Ke Wei, Taipei Hsien (TW)

(73) Assignee: Hon Hai Precision Industry Co., Ltd., Tu-Cheng, New Taipei (TW)

( * ) Notice: Subject to any disclaimer, the term of this patent is extended or adjusted under 35 U.S.C. 154(b) by 203 days.

(21) Appl. No.: 12/909,859

(22) Filed: Oct. 22, 2010

(65) Prior Publication Data
US 2012/0044631 A1   Feb. 23, 2012

(30) Foreign Application Priority Data
Aug. 18, 2010   (TW) .................................. 99127513 A

(51) Int. Cl.
*H05K 7/20* (2006.01)

(52) U.S. Cl. .............. 361/679.47; 361/679.46; 361/696; 361/699; 165/104.33; 165/122; 62/259.2

(58) Field of Classification Search ............... 361/679.46–679.53, 690–696, 361/717–724, 728, 729, 831; 165/80.2–80.5, 165/104.22, 104.33, 104.34, 121–126, 185; 312/223.2, 223.3; 62/3.3, 59, 135, 137, 259.2; 454/137, 184
See application file for complete search history.

(56) References Cited

U.S. PATENT DOCUMENTS

| | | | | |
|---|---|---|---|---|
| 5,150,277 A * | 9/1992 | Bainbridge et al. | .......... | 361/695 |
| 6,034,873 A * | 3/2000 | Ståhl et al. | ..................... | 361/701 |
| 6,496,366 B1 * | 12/2002 | Coglitore et al. | ........ | 361/679.46 |
| 7,278,273 B1 * | 10/2007 | Whitted et al. | .............. | 62/259.2 |
| 7,325,410 B1 * | 2/2008 | Bean, Jr. | ......................... | 62/137 |
| 7,367,384 B2 * | 5/2008 | Madara et al. | ................ | 165/122 |
| 7,738,251 B2 * | 6/2010 | Clidaras et al. | ............... | 361/701 |
| 7,800,900 B1 * | 9/2010 | Noteboom et al. | ...... | 361/679.47 |
| 7,944,692 B2 * | 5/2011 | Grantham et al. | ............ | 361/688 |
| 7,957,142 B2 * | 6/2011 | Noteboom et al. | ........... | 361/696 |
| 7,961,463 B2 * | 6/2011 | Belady et al. | ................. | 361/695 |
| 7,971,446 B2 * | 7/2011 | Clidaras et al. | .............. | 62/259.2 |
| 7,990,710 B2 * | 8/2011 | Hellriegel et al. | ............. | 361/699 |
| 8,031,468 B2 * | 10/2011 | Bean et al. | .................... | 361/696 |
| 8,180,495 B1 * | 5/2012 | Roy | .............................. | 700/278 |
| 8,184,435 B2 * | 5/2012 | Bean et al. | .................... | 361/696 |

* cited by examiner

*Primary Examiner* — Michail V Datskovskiy
(74) *Attorney, Agent, or Firm* — Altis Law Group, Inc.

(57) ABSTRACT

An exemplary server system includes a server cabinet, racks arranged in the server cabinet, servers mounted on the racks, and a heat dissipation device. The heat dissipation device includes a heat exchanger arranged over the racks, a first fan module arranged under the racks for drawing cooling air from the heat exchanger to the servers to exchange heat, and a second fan module including drawing fans respectively arranged on the racks for drawing up heated air from the servers to the heat exchanger.

15 Claims, 3 Drawing Sheets

SERVER SYSTEM WITH HEAT DISSIPATION DEVICE

BACKGROUND

1. Technical Field

The present disclosure relates to heat dissipation, and more particularly to a server system having a heat dissipation device.

2. Description of Related Art

In a typical server system, many servers are densely arranged in a single cabinet. Each of the servers includes at least a power supply device, a motherboard, a hard disk drive, and an optical disk drive, and thus considerable heat is generated during operation. The servers may suffer damage if the heat is not efficiently removed.

What is needed, therefore, is a means which can overcome the limitations described.

DETAILED DESCRIPTION

Figure 1:
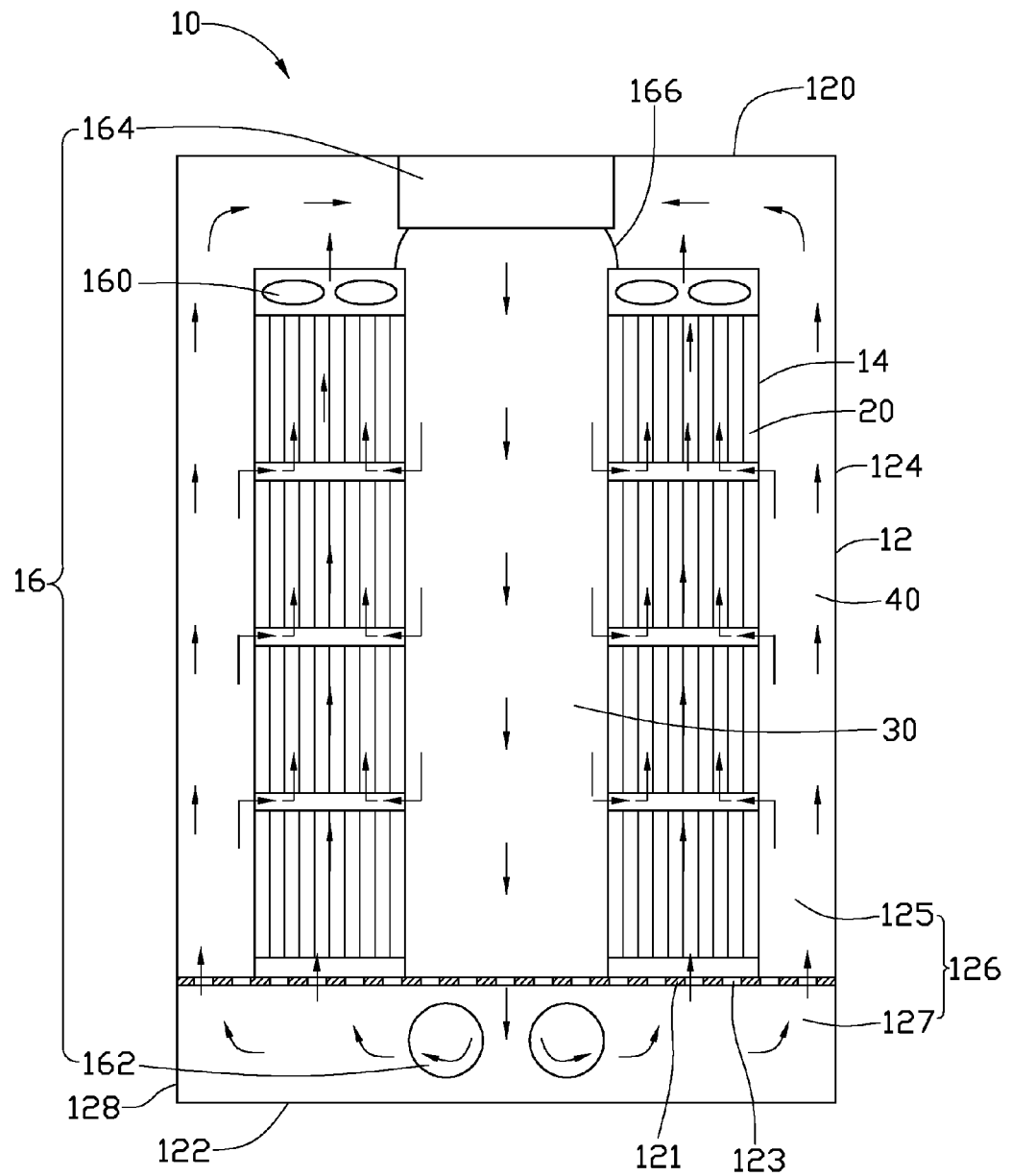
FIG. 1 is a schematic, front side cross-sectional view of a server system in accordance with an embodiment of the disclosure.

Referring to FIG. 1, a server system 10 in accordance with an exemplary embodiment is shown. The server system 10 includes a server cabinet 12, a number of racks 14 accommodated in the server cabinet 12, a number of servers 20 mounted on the racks 14, and a heat dissipation device 16 for cooling the servers 20.

The server cabinet 12 includes a top plate 120, a bottom plate 122 under the top plate 120, a left plate 128 interconnecting left edges of the top and bottom plates 120 and 122, and a right plate 124 interconnecting right edges of the top and bottom plates 120 and 122. The top plate 120, the bottom plate 122, the left plate 128, and the right plate 124 cooperatively define a space 126 in the server cabinet 12.

A support plate 121 is arranged in the space 126 of the server cabinet 12. In this embodiment, the support plate 121 is substantially parallel to the top and bottom plates 120 and 122, but is closer to the bottom plate 122. Left and right edges of the support plate 121 are respectively joined to the left plate 128 and right plate 124. Alternatively, the support plate 121, the left plate 128 and the right plate 124 may be portions of a single, monolithic body. The support plate 121 separates the space 126 into two portions, i.e., an upper portion 125 over the support plate 121 and a lower portion 127 under the support plate 121. The upper portion 125 has a height greater than the lower portion 127. A number of ventilation holes 123 are defined in the support plate 121, the ventilation holes 123 communicating the upper portion 125 with the lower portion 127.

Figure 2:
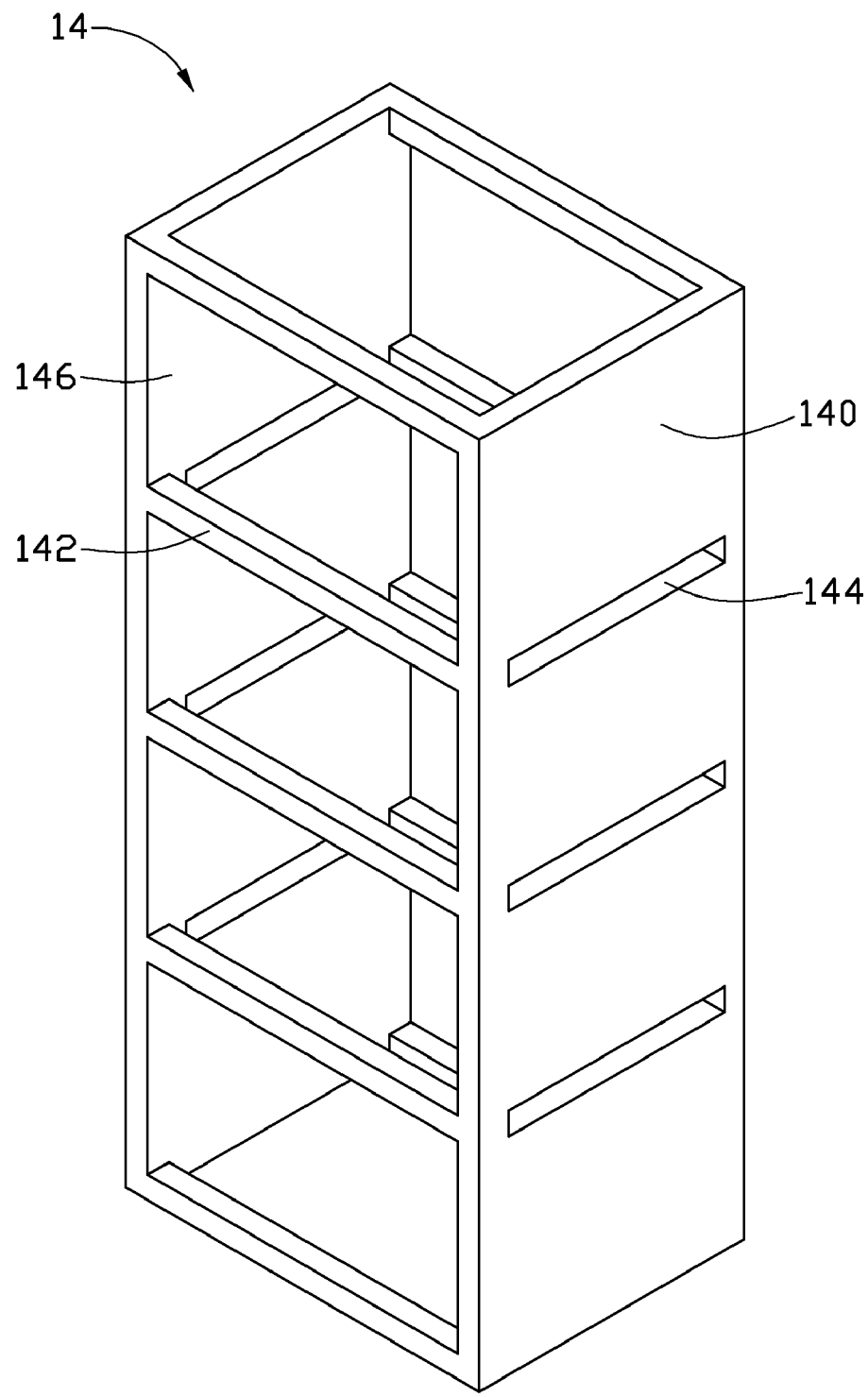
FIG. 2 is a schematic, isometric view of a rack of the server system of FIG. 1.

The racks 14 are arranged in the upper portion 125 of the space 126, and are supported by the support plate 124. Referring also to FIG. 2, each rack 14 includes two vertical walls 140 arranged substantially parallel and spaced from each other, and a number of pairs of rails 142 between the vertical walls 140. The vertical walls 140 each have a rectangular configuration. In this embodiment, a height of the rack 14 is less than that of the upper portion 125 of the space 126.

The rails 142 are evenly distributed along a vertical axis of the rack 14. The rails 142 of each pair are at the same level, and substantially parallel to and spaced from each other. A chamber 146 is defined between each two neighboring pairs of rails 142. A height of the chamber 146 is approximately equal to a width of a short side of each server 20. A number of grooves 144 are defined through each of the vertical walls 140. Each of the grooves 144 is elongated, and has a length approximately the same as the distance between each pair of rails 142. In this embodiment, the number of grooves 144 of each vertical wall 140 is two less than the number of pairs of rails 142. Except for the topmost and bottommost pairs of rails 142, each pair of rails 142 is substantially aligned with two corresponding grooves 144 of the vertical walls 140.

When assembled, the racks 14 are received in the upper portion 125 of the space 126, and placed side by side along a direction from the left plate 128 to the right plate 124. The vertical walls 140 of the racks 14 are oriented substantially parallel to the left and right plates 128 and 124. In this embodiment, the server cabinet 12 has two racks 14 received therein. A channel 30 is defined between the racks 14, and a passage 40 is defined between each of the left and right plates 128 and 124 and a corresponding neighboring rack 14. Alternatively, a size of the server cabinet 12 can be larger to accommodate more racks 14 therein, thereby allowing mounting of more servers 20 in the server cabinet 12 according to need.

Figure 3:
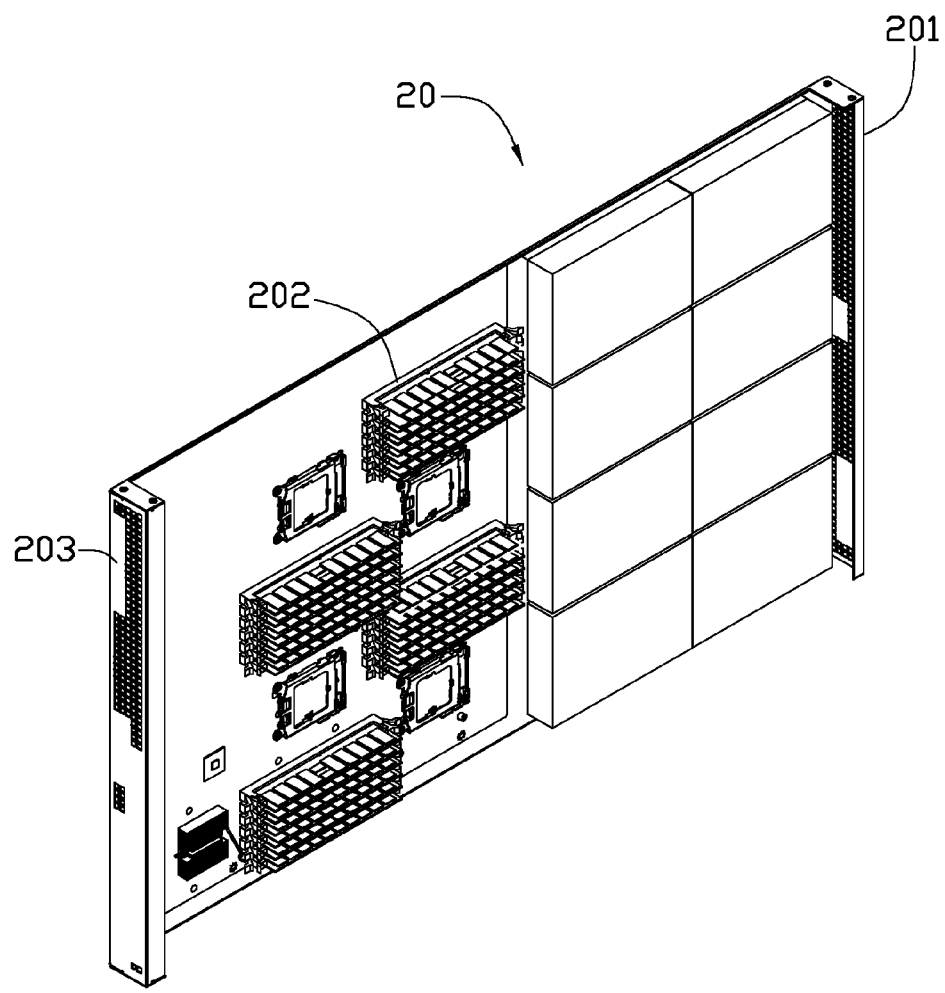
FIG. 3 is a schematic, isometric view of a server of the server system of FIG. 1.

Each of the chambers 146 of the racks 14 can accommodate a number of servers 20. The servers 20 in the chambers 146 stand vertically, and are substantially parallel to the vertical walls 140. Referring to FIG. 3, in this embodiment, the servers 20 are blade servers, and have a number of electronic components 202 mounted therein. Each of the servers 20 has a standard rectangular outline. Front and rear flanges 203 and 201 respectively extend in a same direction from front and rear ends of each server 20 to abut a neighboring server 20. The front flanges 203 of the plurality of servers 20 at a front side of each chamber 146 cooperatively form a continuous wall to prevent air from escaping out of the servers 20 through the front side thereof. The rear flanges 201 of the plurality of servers 20 at a rear side of each chamber 146 cooperatively form a continuous wall to prevent air from escaping out of the servers 20 through the rear side thereof.

Referring to FIG. 1 again, the heat dissipation device 16 includes a first fan module 162, a second fan module 160 and a heat exchanger 164. In this embodiment, the first fan module 162 is received in the lower portion 127 of the space 126 of the server cabinet 12, and includes a number of axial fans oriented with air intakes thereof aligned with the channel 30 and air outlets thereof opposing the left plate 128 or the right plate 124. The second fan module 160 includes a number of drawing fans respectively disposed on the racks 14. In the illustrated embodiment, there are two drawing fans. The heat exchanger 164 is fixed on the top plate 120 of the server cabinet 12. In this embodiment, the heat exchanger 164 is an ice water heat exchanger. A separating board 166 is provided between the heat exchanger 164 and the second fan module 160 to enclose a top end of the channel 30. The separating board 166 can for example be four-sided. In another example, there can be two separating boards 166, one at each of the two drawing fans of the second fan module 160.

During operation of the servers 20, the first fan module 162 draws cooling air from the heat exchanger 164 down along the channel 30. A portion of the cooling airflow divides into a number of branches to proceed transversely through the grooves 144 of corresponding neighboring vertical walls 140 into the racks 14, thereby exchanging heat with the servers 20.

The remaining cooling air flows down through the ventilation holes 123 of the support plate 121 to the first fan module 162, and then towards the left plate 128 and the right plate 124 under the action of the first fan module 162. A portion of the cooling air exhausted out of the first fan module 162 directly flows up through the support plate 121 into the racks 14, to exchange heat with the servers 20. Simultaneously, a remaining portion of the cooling air exhausted out of the first fan module 162 flows up along the passages 40 and into the racks 14 through the grooves 144 of the vertical walls 140 adjacent to the left and right plates 128 and 124, to exchange heat with the servers 20.

The heated air in the racks 14 is drawn up by the fans of the second fan module 160 to the heat exchanger 164. The separating board 166 stops the heated air from crossing from the servers 20 to the channel 30. Finally, the heat of the heated air is dissipated to an exterior of the server system 10 by the heat exchanger 164, and thus the heat exchanger 164 provides downward cooling air to the channel 30 to continually take away the heat of the servers 20. Therefore the heat dissipation device 16 can remove the heat generated by the servers 20, and accordingly the servers 20 can maintain a low working temperature.

It is to be understood, however, that even though numerous characteristics and advantages of certain embodiments have been set forth in the foregoing description, together with details of the structures and functions of the embodiments, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. A server system, comprising:
   a server cabinet;
   a plurality of racks received in the server cabinet;
   a plurality of servers mounted on the racks; and
   a heat dissipation device comprising:
      a heat exchanger arranged over the racks;
      a first fan module arranged under the racks for drawing cooling air from the heat exchanger to the servers to exchange heat therewith; and
      a second fan module comprising a plurality of drawing fans respectively arranged on the racks for drawing up heated air from the servers to the heat exchanger;
   wherein the first fan module comprises a plurality of axial fans oriented with air intakes thereof aligned with the heat exchanger;
   wherein the server cabinet comprises a top plate, a bottom plate under the top plate, a left plate interconnecting left edges of the top and bottom plates, and a right plate interconnecting right edges of the top and bottom plates, and wherein the racks are distributed between the left and right plates, and a channel is defined between the racks aligned with the heat exchanger; and
   wherein the server cabinet further comprises a support plate separating an interior of the server cabinet into an upper portion over the support plate and a lower portion under the support plate, a plurality of ventilation holes being defined in the support plate, the racks being received in the upper portion, the first fan module being received in the lower portion.

2. The server system of claim 1, wherein the support plate is parallel to the top and bottom plates, and is joined to the left and right plates, the bottom plate is near to the support plate than the top plate.

3. The server system of claim 1, wherein air outlets of the axial fans of the first fan module are oriented towards the left and right plates.

4. The server system of claim 1, wherein the heat exchanger is an ice water heat exchanger, and is fixed on the top plate of the server cabinet.

5. The server system of claim 1, wherein the server cabinet further comprises a separating board arranged between the second fan module and the heat exchanger to enclose a top of the channel.

6. The server system of claim 1, wherein each rack comprises two vertical plates and a plurality of rails between the vertical plates, the vertical plates are parallel to the left and right plates, and each vertical plate defines a plurality of grooves corresponding to the rails.

7. The server system of claim 6, wherein the servers are blade servers, and stand on the rails.

8. A server system, comprising:
   a server cabinet comprising two opposite side plates;
   a plurality of racks arranged side by side between the two side plates, the racks spaced from each other and from the two side plates, a channel being defined between two neighboring racks;
   a plurality of servers mounted on the racks; and
   a heat dissipation device mounted in the server cabinet, the heat dissipation device comprising a heat exchanger arranged over the channel, a first fan module arranged under the channel for drawing cooling air from the heat exchanger, and a second fan module comprising a plurality of drawing fans respectively arranged on the racks for drawing up heated air from the servers to the heat exchanger;
   wherein the first fan module comprises a plurality of axial fans oriented with air intakes thereof aligned with the heat exchanger and air outlets thereof facing the two side plates of the server cabinet.

9. The server system of claim 8, wherein the server cabinet further comprises a support plate between the two side plates of the server cabinet, the support plate defining a plurality of ventilation holes therein, the racks being mounted on the separating plate, the first fan module being arranged under the support plate.

10. The server system of claim 9, wherein the server cabinet further comprises a top plate interconnecting top edges of two side plates, and a bottom plate interconnecting bottom edges of the two side plates, the support plate being parallel to the top and bottom plates, the bottom plate being near to the support plate than the top plate.

11. The server system of claim 10, wherein the heat exchanger is an ice water heat exchanger, and is fixed on the top plate.

12. The server system of claim 8, wherein each rack comprises two vertical plates and a plurality of rails connected between the vertical plates, the vertical plates are parallel to the two side plates, and each vertical plate defines a plurality of grooves corresponding to the rails.

13. The server system of claim 8, wherein the servers are blade servers.

14. The server system of claim 8, wherein the server cabinet further comprises a separating board arranged between the second fan module and the heat exchanger to enclose a top of the channel.

15. A server system, comprising:
   a server cabinet comprising two opposite side plates;

a plurality of racks arranged side by side between the two side plates, the racks spaced from each other and from the two side plates, a channel being defined between two neighboring racks;

a plurality of servers mounted on the racks; and a heat dissipation device mounted in the server cabinet, the heat dissipation device comprising a heat exchanger arranged over the channel, a first fan module arranged under the channel for drawing cooling air from the heat exchanger, and a second fan module comprising a plurality of drawing fans respectively arranged on the racks for drawing up heated air from the servers to the heat exchanger; and wherein each rack comprises two vertical plates and a plurality of rails connected between the vertical plates, the vertical plates are parallel to the two side plates, and each vertical plate defines a plurality of grooves corresponding to the rails.

* * * * *